United States Patent
Qiu et al.

(10) Patent No.: US 8,582,250 B2
(45) Date of Patent: Nov. 12, 2013

(54) DOUBLE BIASING FOR TRILAYER MR SENSORS

(75) Inventors: Jiaoming Qiu, Saint Paul, MN (US);
Yonghua Chen, Edina, MN (US);
Kaizhong Gao, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 285 days.

(21) Appl. No.: 12/631,183

(22) Filed: Dec. 4, 2009

(65) Prior Publication Data

US 2011/0134572 A1    Jun. 9, 2011

(51) Int. Cl.
*G11B 5/33* (2006.01)
*G11B 5/127* (2006.01)

(52) U.S. Cl.
USPC .................................... 360/324.12

(58) Field of Classification Search
USPC ........................ 360/324.1–324.12
See application file for complete search history.

(56) References Cited

U.S. PATENT DOCUMENTS

| | | | |
|---|---|---|---|
| 6,310,751 B1 | 10/2001 | Guo et al. | |
| 6,466,419 B1 | 10/2002 | Mao | |
| 6,556,388 B1 | 4/2003 | Everitt et al. | |
| 6,556,392 B1 | 4/2003 | Mao et al. | |
| 6,704,176 B2 | 3/2004 | Shukh et al. | |
| 6,714,389 B1 | 3/2004 | Pokhil et al. | |
| 6,735,062 B1* | 5/2004 | Pokhil et al. | 360/324.12 |
| 6,780,291 B2* | 8/2004 | Kim | 204/192.2 |
| 7,016,166 B1 | 3/2006 | Hou et al. | |
| 7,035,061 B2 | 4/2006 | Singleton et al. | |
| 7,072,209 B2 | 7/2006 | Deak | |
| 7,186,471 B2* | 3/2007 | Lu et al. | 428/836.1 |
| 7,259,941 B2 | 8/2007 | Pinarbasi | |
| 7,271,986 B2 | 9/2007 | Sapozhnikov et al. | |
| 7,330,340 B2 | 2/2008 | Gill | |
| 7,331,100 B2 | 2/2008 | Li et al. | |
| 7,333,306 B2 | 2/2008 | Zhao et al. | |
| 7,345,854 B2 | 3/2008 | Takano | |
| 7,350,284 B2 | 4/2008 | Pinarbasi | |
| 7,390,529 B2 | 6/2008 | Li et al. | |
| 7,390,530 B2 | 6/2008 | Wang et al. | |
| 7,400,475 B2 | 7/2008 | Horng et al. | |
| 7,423,850 B2 | 9/2008 | Gill et al. | |
| 7,466,524 B2 | 12/2008 | Freitag et al. | |
| 7,468,214 B2 | 12/2008 | Lu et al. | |
| 2001/0021087 A1* | 9/2001 | Guo et al. | 360/315 |
| 2002/0015268 A1* | 2/2002 | Mao et al. | 360/324.12 |
| 2004/0047089 A1* | 3/2004 | Singleton et al. | 360/327.31 |

(Continued)

OTHER PUBLICATIONS

Belleson, Jim and Grochowski, Ed. "The era of giant magnetoresistive heads." Hitachi Global Storage Technologies. 4 pages. 2009. Retrieved Feb. 4, 2009 from <http://www.hitachigst.com/hdd/technolo/gmr/gmr.htm>.

(Continued)

*Primary Examiner* — Wayne Young
*Assistant Examiner* — Adam B Dravininkas
(74) *Attorney, Agent, or Firm* — Hall Estill Attorneys at Law (57) ABSTRACT

A trilayer magnetoresistive sensor has at least first and second ferromagnetic layers separated by a nonmagnetic layer. A high coercivity permanent magnet bias element biases the first ferromagnetic layer in a first direction. A high moment permanent magnet bias element biases the second ferromagnetic layer in a second direction substantially orthogonal to the first direction.

17 Claims, 7 Drawing Sheets

(56) References Cited

U.S. PATENT DOCUMENTS

| | | | |
|---|---|---|---|
| 2004/0114280 A1* | 6/2004 | Yoshikawa et al. | 360/314 |
| 2004/0141257 A1* | 7/2004 | Hasegawa et al. | 360/314 |
| 2005/0088789 A1* | 4/2005 | Hou et al. | 360/324.12 |
| 2005/0146813 A1* | 7/2005 | Oshima | 360/324.12 |
| 2006/0002032 A1 | 1/2006 | Li et al. | |
| 2006/0256485 A1* | 11/2006 | Seigler et al. | 360/324.12 |
| 2007/0076332 A1* | 4/2007 | Shoji et al. | 360/324.12 |
| 2009/0180217 A1* | 7/2009 | Chou et al. | 360/324 |
| 2009/0207533 A1* | 8/2009 | Shimazawa | 360/324.1 |
| 2010/0079917 A1* | 4/2010 | Miyauchi et al. | 360/319 |
| 2010/0214696 A1* | 8/2010 | Matsuzawa et al. | 360/235.4 |

OTHER PUBLICATIONS

Lia, Jian and Rau, Carl. "Magnetic domain structures of focused ion beam-patterned cobalt films using scanning ion microscopy with polarization analysis." Journal of Applied Physics. vol. 95. No. 11. pp. 6527-6529. Jun. 1, 2004. American Institute of Physics.

* cited by examiner

DOUBLE BIASING FOR TRILAYER MR SENSORS

SUMMARY

A trilayer magnetoresistive sensor is generally described. The trilayer sensor is comprised of two free ferromagnetic layers separated by a nonmagnetic spacer layer. One free layer is biased with a high coercivity magnet positioned adjacent the layer and the other free layer is biased with a high moment magnet positioned adjacent that layer. The layers are biased such that the magnetizations of both layers are substantially orthogonal to each other.

DETAILED DESCRIPTION

Figure 1:
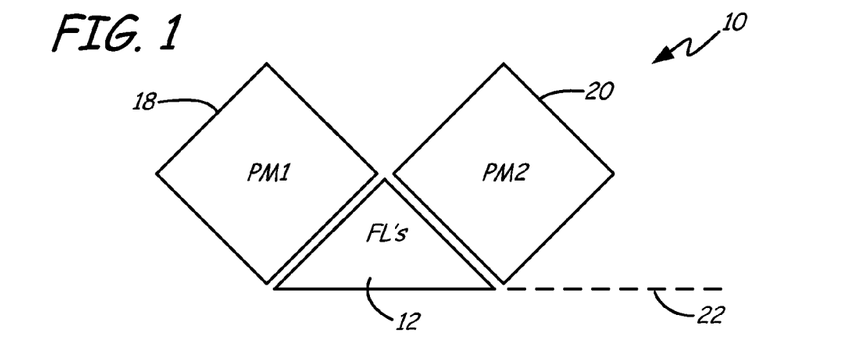
FIG. 1 is a schematic top view of a trilayer reader stack according to an aspect of the invention.
Figure 3:
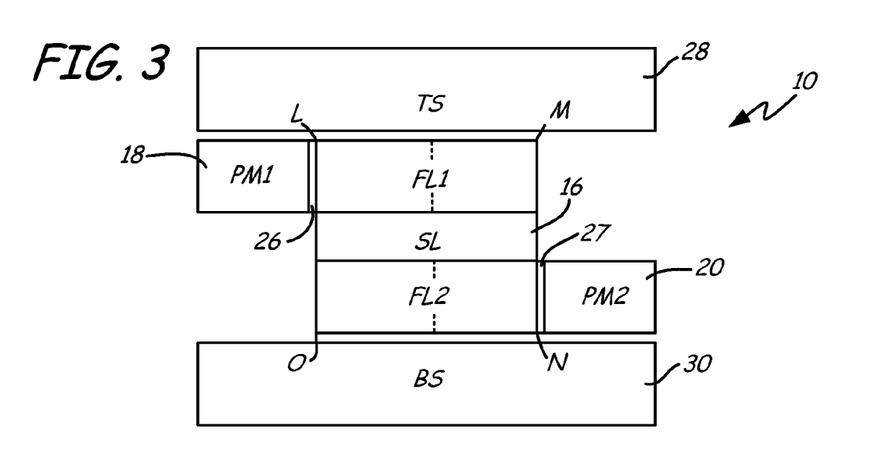
FIG. 3 is a schematic air bearing surface (ABS) view of the trilayer stack in FIG. 2.

FIG. 1 shows a schematic top view of an example aspect of the present disclosure. FIG. 1 shows an embodiment of a trilayer reader stack 10 comprising triangular ferromagnetic free layer 12 and triangular ferromagnetic free layer 14 (not shown) sandwiching triangular nonmagnetic spacer layer 16 (not shown). Triangular ferromagnetic free layers 12 and 14 and nonmagnetic spacer layer 16 face air bearing surface (ABS) 22 as shown. First permanent magnet bias layer 18 is adjacent first ferromagnetic free layer 12 and second permanent bias magnet layer 20 is adjacent second ferromagnetic free layer 14. Although first and second permanent magnet bias layers are shown with square outlines, other shapes can be used depending on system requirements. FIG. 3 shows trilayer stack 10 sandwiched between two shield layers.

Figure 2:
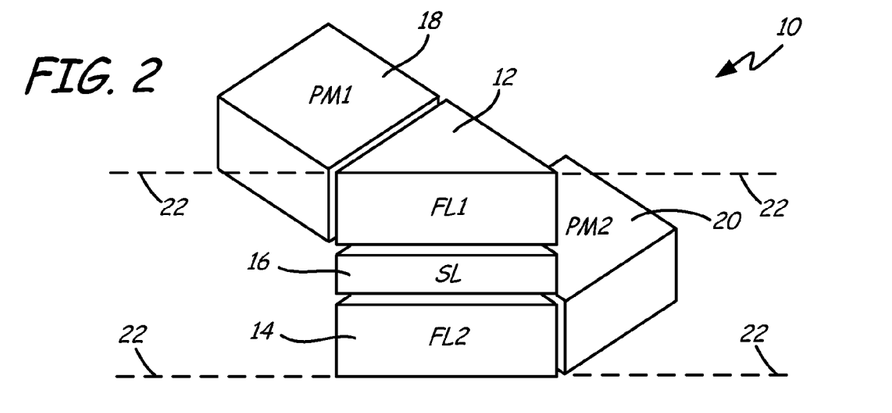
FIG. 2 is a perspective exploded view of the trilayer stack in FIG. 1 indicating how the components are assembled.

FIG. 2 shows a perspective exploded view of the example trilayer stack 10 of FIG. 1 to indicate how the biasing magnets and free layers are assembled. Insulating layers are omitted for clarity. FIG. 2 shows first permanent magnet bias layer 18 positioned adjacent first free layer 12, which in turn, is on spacer layer 16. Spacer layer 16 can be either a nonmagnetic conducting spacer layer such that trilayer stack 10 is a GMR sensor or a nonconducting spacer layer such that trilayer stack 10 is a TGMR sensor. Second ferromagnetic free layer 14 is under spacer layer 16 and is positioned adjacent second permanent magnetic layer 20. The bottom edges of first ferromagnetic free layer 12, spacer layer 16 and second free layer 14 comprise air bearing surface (ABS) 22.

An ABS view of the example trilayer stack 10 of FIG. 1 is shown in FIG. 3. Top shield 28 and bottom shield 30 are shown defining active area LMNO of trilayer reader stack 10 at ABS 22. First and second permanent bias magnets 18 and 20 are distal from ABS 22 and are separated from first and second ferromagnetic free layers 12 and 14 by insulating layers 26 and 27.

For enhanced sensitivity, the magnetization directions of ferromagnetic free layers 12 and 14 need to be biased generally orthogonal with respect to one another. This magnetization configuration allows for greater sensitivity and response to flux emanating from magnetic recording media and allows for greater control over the magnetic response of the free layers to the magnetic fields of the recording media.

Figure 4A:
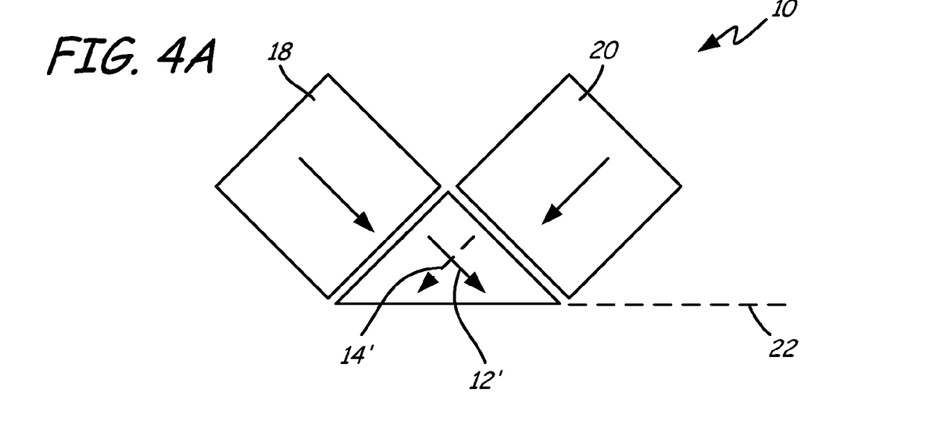
FIG. 4A is a schematic top view of the trilayer stack and magnetic bias layers of FIG. 1 showing biasing in the absence of external bit flux.
Figure 4B:
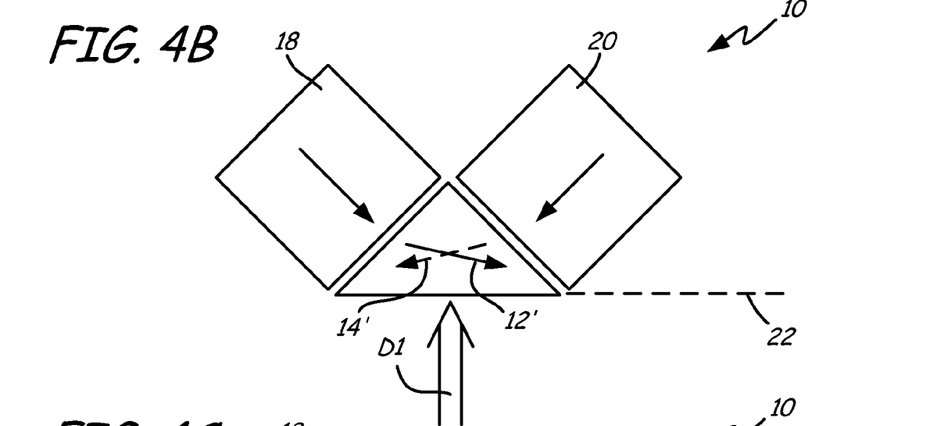
FIG. 4B is a schematic top view of the trilayer stack in FIG. 4A under the influence of a first state of data.
Figure 4C:
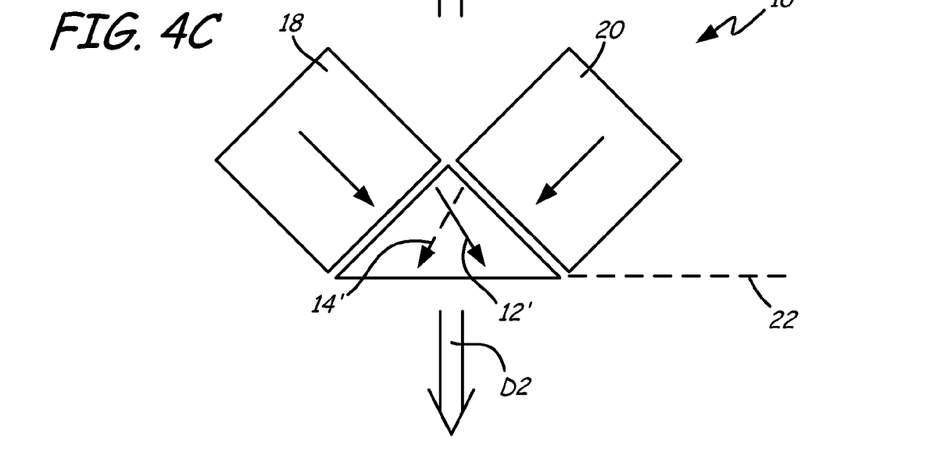
FIG. 4C is a schematic top view of the trilayer stack in 4A under the influence of a second state of data.

FIGS. 4A, 4B, and 4C show top views of the example trilayer reader stack 10 with the magnetization vector of permanent bias magnet layer 18 oriented with respect to ferromagnetic free layer 12 and the magnetization vector of permanent bias magnet layer 20 oriented with respect to ferromagnetic free layer 14 to achieve enhanced response of free layers 12 and 14 to external magnetic fields. The magnetizations of permanent magnet bias layers 18 and 20 are set substantially orthogonal as shown. FIGS. 4A-4C illustrate the effect of varying bit magnetizations on the recorded media on the magnetization directions 12' and 14' of first ferromagnetic free layer 12 and second ferromagnetic free layer 14, respectively. FIG. 4A shows trilayer reader stack 10 in a quiescent magnetic state when it is not under the influence of magnetic flux emanating from the recording media. The angle of magnetization between first ferromagnetic free layer 12 and second ferromagnetic free layer 14 at ABS 22 is substantially orthogonal in a scissors relation for enhanced sensor response. FIG. 4B is a top view of trilayer reader stack 10 showing trilayer reader stack 10 under the influence of a first state of data D1 corresponding to a positive bit. This first state of data causes the angle of magnetization between first free layer 12 and second free layer 16 to increase at ABS 22. When this occurs, the resistance across trilayer reader stack 10 changes and is detected when a sense current is passed through trilayer reader stack 10. FIG. 4C is a top view of trilayer reader stack 10, showing trilayer reader stack 10 under the influence of a second state of data D2 corresponding to a negative bit. This second state of data causes the angle of magnetization between first free layer 12 and second free layer 16 to decrease at ABS 22. As with the first state of data, the second state of data causes a change in resistance across trilayer reader stack 10 and is detected when a sense current is passed through trilayer reader stack 10.

First permanent magnet bias layer 18 is a high coercivity magnet comprising a magnetic setting field exceeding 2T.

Second permanent magnet bias layer 20 is a high moment magnet with a magnetic setting field sufficiently below the setting field of first permanent magnet bias layer 18 such that the setting of first permanent magnet bias layer 18 is not affected by the setting of second permanent magnet bias layer 20. For example, the magnetic setting field of second permanent magnet bias layer 20 may be on the order of about 6 KOe to about 7 KOe. First permanent magnet bias layer 18 is, for example, a high coercivity $L1_0$ phase FePt alloy and second permanent magnet bias layer 20 is, for example, $Co_3Pt$. Free ferromagnetic layers 12 and 14 are preferably ferromagnetic material with good anisotropy such as NiFeCo or CoFeHf. Shield layers 28 and 30 are preferably NiFe, iron amorphous alloys, permalloy or sendust. Spacer layer 16 may be a conductor such as Cu, Ag, or Au if stack 10 is a GMR stack, or an insulator such as $Al_2O_3$, $TiO_2$ or MgO if stack 10 is a TGMR stack.

In FIG. 4A the initial magnetization directions of first ferromagnetic free layer 12 and second ferromagnetic free layer 14 are shown to be orthogonal. Magnetic alignment between first and second permanent magnet bias layers 18 and 20 is adjustable by altering the direction of the setting field when magnetizing the bias layers. The strength of the magnetic field of each permanent magnet bias layer can be controlled by varying the thickness of the bias magnet layers. These modifications can be performed as the particular specifications of the MR reader containing trilayer sensor 10 dictate. A primary benefit is that the sensor does not contain antiferromagnetic pinning and synthetic antiferromagnetic pinned structures, thereby minimizing the shield-to-shield spacing and maximizing the areal density detected by the reader. The free layer biasing comes from the combination of back end permanent magnet bias layers 18 and 20 and demagnetization fields when free layers 12 and 14 have ends at air bearing surface 22.

Figure 5:
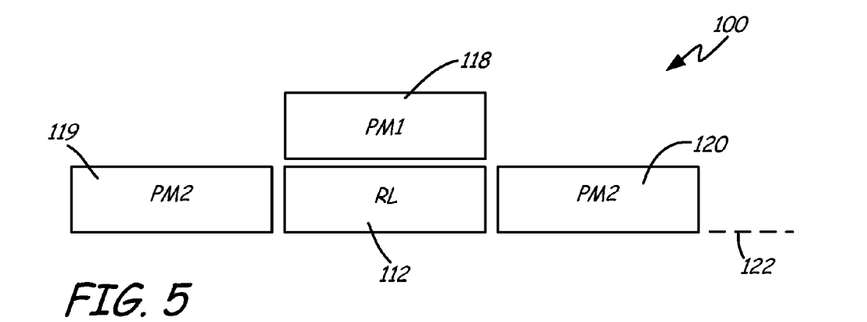
FIG. 5 is a schematic top view of another configuration a trilayer reader stack.
Figure 7:
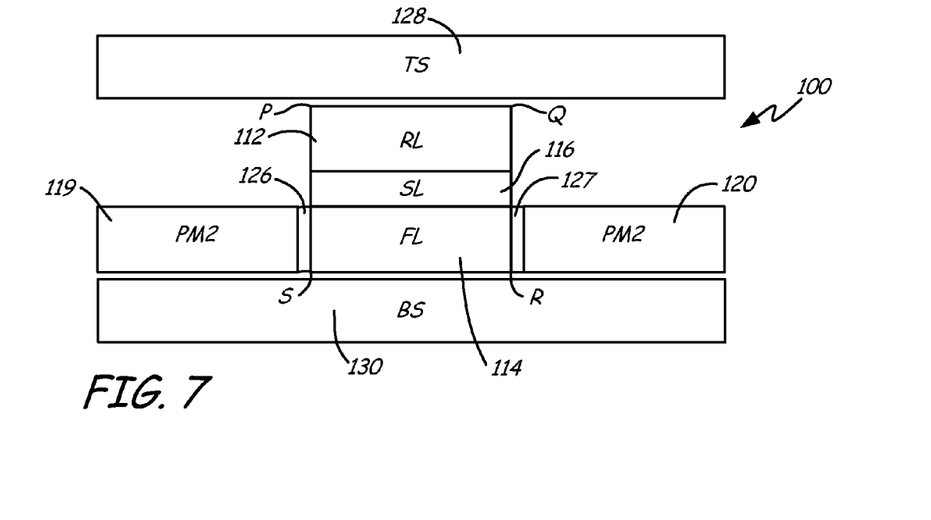
FIG. 7 is a schematic ABS view of the trilayer stack in FIG. 6.

FIG. 5 shows a schematic top view of another example configuration of a trilayer reader with a fixed reference layer, a free layer, a spacer layer and separately settable bias magnets. FIG. 5 shows trilayer reader stack 100 comprising reference layer 112 and free layer 114 (not shown) sandwiching nonmagnetic spacer layer 116 (not shown). First permanent magnet bias layer 118 is adjacent reference layer 112. Second permanent magnet bias layers 119 and 120 are adjacent free layer 114. Although first permanent magnet bias layer 118 and second permanent magnet bias layers 119 and 120 are shown with square outlines, other shapes can be used depending on system requirements. Permanent magnet bias layers 119 and 120 can be replaced by a single permanent magnet bias layer if desired. FIG. 7 shows trilayer stack 100 sandwiched between two shield layers.

Figure 6:
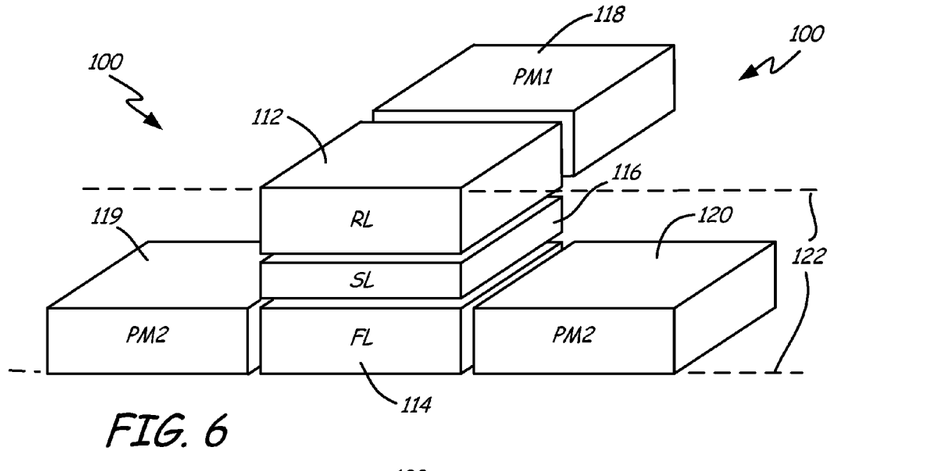
FIG. 6 is a perspective exploded view of the trilayer stack in FIG. 5 indicating how the components are assembled.

FIG. 6 shows a perspective exploded view of the trilayer stack 100 of FIG. 5 to indicate how biasing magnets 118-120 and reference layer 112 and free layer 114 are assembled. Insulating layers are omitted for clarity. FIG. 6 shows first permanent magnet bias layer 118 abutting reference layer 112 distal from ABS 122. Reference layer 112 is on spacer layer 116 which, in turn, is on ferromagnetic free layer 114. Second permanent magnet bias layers 119 and 120 abut free layer 114. The bottom edges of reference layer 112, spacer layer 116, free layer 114 and permanent magnet bias layers 119 and 120 face air bearing surface (ABS) 122.

An ABS view of trilayer stack 100 is shown in FIG. 7. Top shield 128 and bottom shield 130 are shown defining active area PQRS of trilayer stack 100 at ABS 122. First permanent magnet bias layer 118 is distal from ABS 122 and is behind reference layer 112 in the FIG. Second permanent magnet bias layers 119 and 120 are shown separated from free layer 114 by electrically insulating layers 126 and 127. A single second permanent bias magnet layer can be used depending on the system requirements.

For enhanced sensitivity, the magnetization directions of layers 112 and 114 need to be biased generally orthogonal with respect to one another. This magnetization configuration allows for greater sensitivity in response to flux emanating from the recording media and allows for greater control over the magnetic response of the free layers to the magnetic fields of the recording media.

Figure 8A:
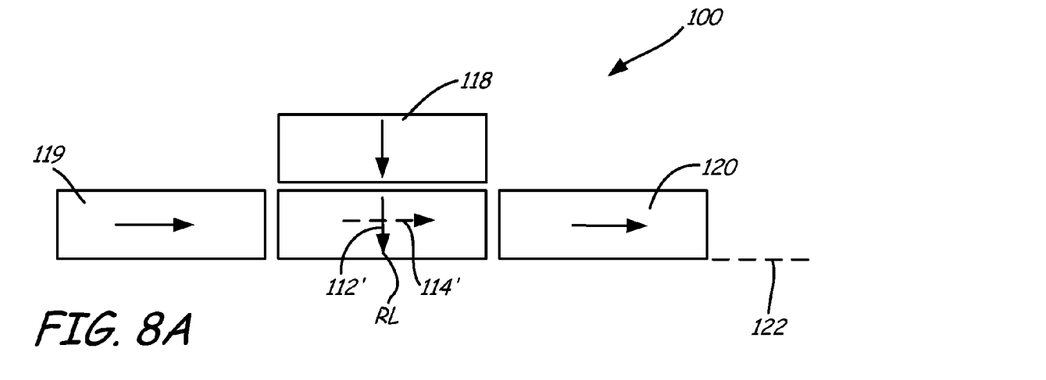
FIG. 8A is a schematic top view of the trilayer stack and magnetic bias layers of FIG. 5 showing biasing in the absence of external bit flux.
Figure 8B:
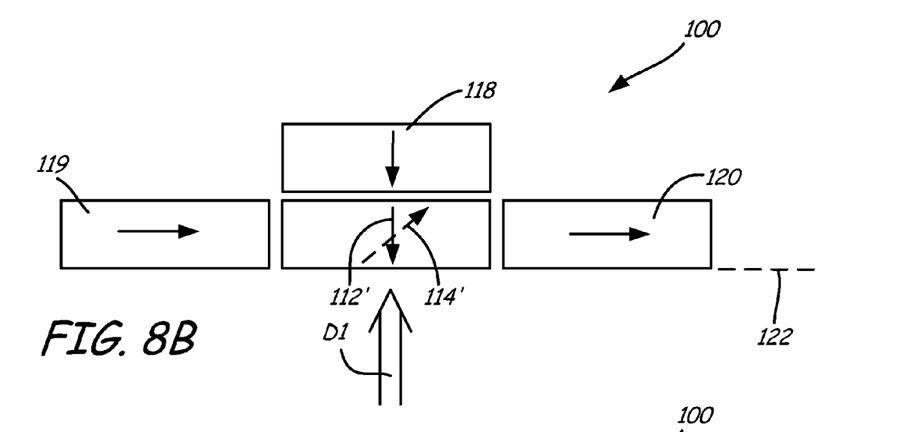
FIG. 8B is a schematic top view of the trilayer stack in FIG. 5 under the influence of a first state of data.
Figure 8C:
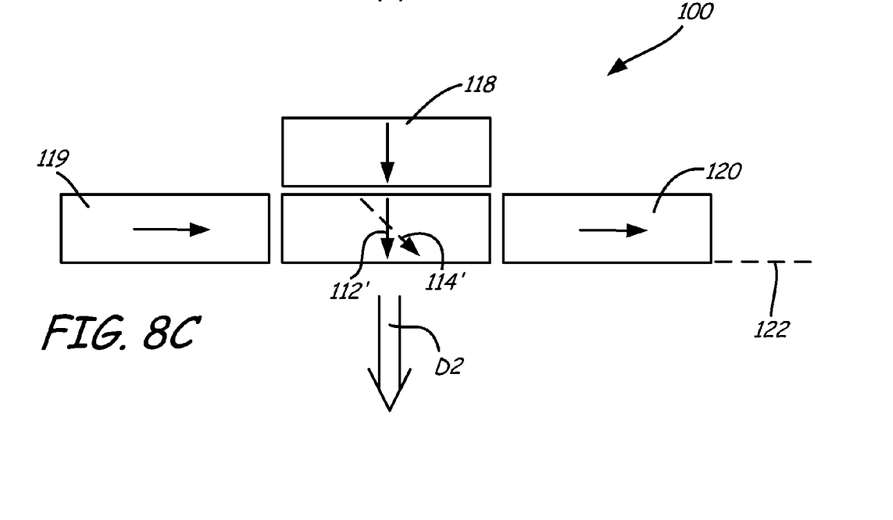
FIG. 8C is a schematic top view of the trilayer stack in FIG. 5 under the influence of a second state of data.

FIGS. 8A, 8B and 8C show top views of the trilayer reader stack 100 shown in FIG. 5 with the magnetization vectors of permanent magnet biasing layers 118, 119 and 120 oriented to achieve enhanced response of reference layer 112 and free layer 114 to external magnetic fields. FIGS. 8A-8C illustrate the effect of varying bit magnetizations on the recorded media on the magnetization directions 112' and 114' of reference layer 112 and free layer 114, respectively. The magnetizations of permanent magnet bias layers 118, 119 and 120 are set substantially orthogonal as shown. FIG. 8A shows trilayer reader stack 100 in a quiescent magnetic state when it is not under the influence of magnetic flux emanating from the recording media. As can be seen, the angle of magnetization between reference layer 112 and free layer 114 at ABS 122 is generally orthogonal. FIG. 8B is a top view of trilayer reader stack 100 showing trilayer reader stack 100 under the influence of a first state of data D1 corresponding to a positive bit. This first state of data causes the angle of magnetization between reference layer 112 and free layer 114 to increase at ABS 122. When this occurs the resistance across trilayer reader stack 100 changes and is detected as a change in voltage as a sense current is passed through trilayer reader stack 100. FIG. 8C is a top view of trilayer reader stack 100 showing trilayer reader stack 100 under the influence of a second state of data D2 corresponding to a negative bit. This second state of data causes the angle of magnetization between reference layer 112 and free layer 114 to decrease at ABS 122. As with the first state of data, the second state of data causes a change in resistance of trilayer reader stack 100 and is detected as a change in voltage as a sense current is passed through trilayer reader stack 100.

First permanent magnet bias layer 118 is a high coercivity magnet comprising a magnetic setting field exceeding 2T. Second permanent magnet bias layers 119 and 120 are high moment magnets with magnetic setting fields sufficiently below the setting field of first permanent magnet bias layer 118 (e.g. about 6 KOe to about 7 KOe) such that the setting of first permanent magnet bias layer 118 is not affected by the setting of second permanent magnet bias layers 119 and 120. First permanent magnet bias layer 118 is, for example, a high coercivity $L1_0$ phase FePt alloy and second permanent magnet bias layers 119 and 120 are, for example, $Co_3Pt$. Reference layer 112 may be a single ferromagnetic layer or trilayer comprising a ferromagnetic reference layer and an antiferromagnetic layer. Free ferromagnetic layer 114 is preferably ferromagnetic material with good anisotropy such as NiFeCo or CoFeHf. Shield layers 128 and 130 are preferably NiFe, iron amorphous alloys, permalloy or sendust. Spacer layer 116 may be a conductor such as Cu, Ag, or Au if stack 100 is a GMR stack, or an insulator such as $Al_2O_3$, $TiO_2$ or MgO if stack 100 is a TGMR stack.

In FIG. 8A the initial magnetization directions of reference layer 112 and free layer 114 are shown to be orthogonal. Magnetic alignment between first and second permanent magnet bias layers 118, 119 and 120 is adjustable by altering the direction of the setting field magnetizing the bias layers. The strength of the magnetic field of each permanent magnet bias layer can be controlled by varying the thickness of the bias magnet layers. These modifications can be performed as the particular specifications of the MR reader containing trilayer sensor 100 dictate. A primary benefit is that the sensor does not contain synthetic antiferromagnetic pinned structures, thereby minimizing the shield-to-shield spacing and maximizing the aerial density detected by the reader.

Figure 9:
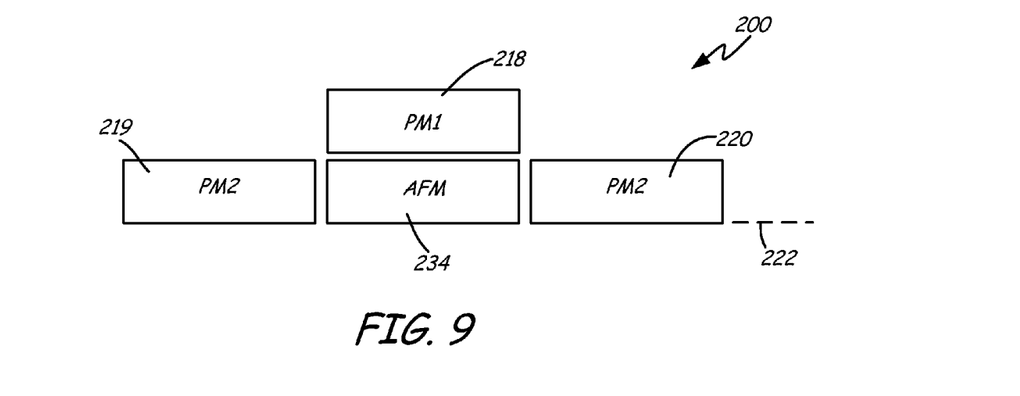
FIG. 9 is a schematic top view of a configuration of a multilayer reader stack.

FIG. 9 shows a schematic top view of another embodiment of a reader with a fixed reference layer, a free layer, a spacer layer, and separately settable bias magnets. FIG. 9 shows reader stack 200 comprising free layer 214, spacer layer 216, reference layer 212, spacer layer 230, ferromagnetic layer 232, all not shown, under antiferromagnetic layer 234. Ferromagnetic layer 232 is pinned through exchange coupling by antiferromagnetic layer 234 and pins the magnetization of reference layer 212, in the same direction as the pinning field of first permanent magnet bias layer 218. Second permanent magnet bias layers 219 and 220 are adjacent free layer 214.

Figure 10:
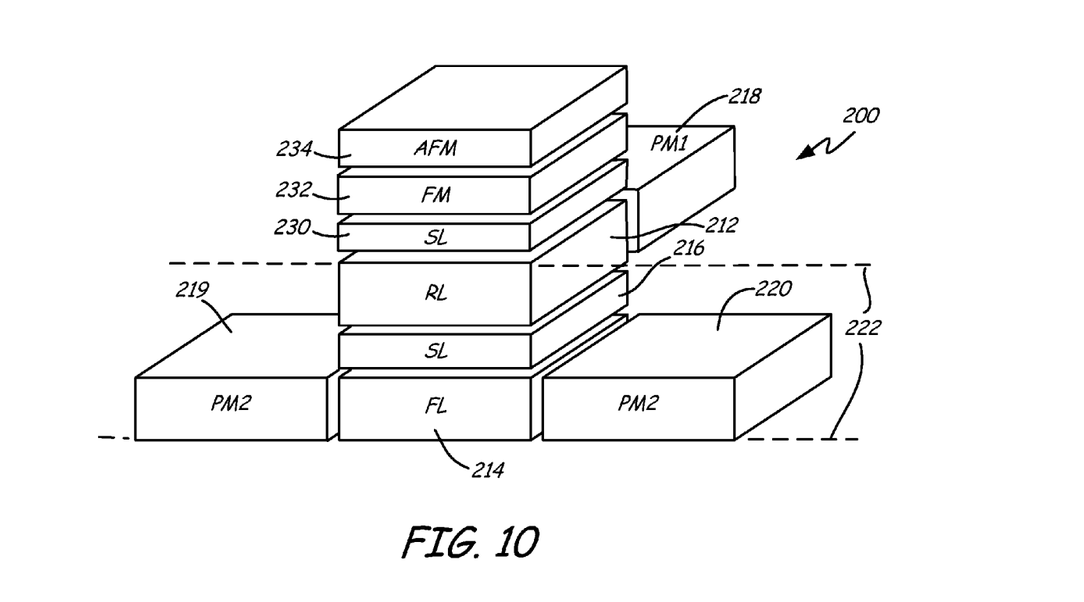
FIG. 10 is a perspective exploded view of the reader stack in FIG. 9 indicating how the components are assembled.

FIG. 10 shows a perspective exploded view of reader stack 200 to indicate how biasing magnets 218-220, free layer 214, spacer layer 216, reference layer 212, spacer layer 230, ferromagnetic layer 232, and antiferromagnetic layer 234 are assembled. Insulating layers are omitted for clarity. FIG. 10 shows first permanent magnet bias layer 218 abutting reference layer 212, distal from ABS 222. Ferromagnetic layer 232 is pinned by antiferromagnetic layer 234 by antiferromagnetic exchange energy. Ferromagnetic layer 232 pins reference layer 212 in the same direction as bias magnet 218. Reference layer 212 is on spacer layer 216, which, in turn, is on ferromagnetic free layer 214. Second permanent magnet bias layers 219 and 220 abut free layer 214. The bottom edges of antiferromagnetic layer 234, ferromagnetic layer 232, spacer layer 230, reference layer 212, spacer layer 216, free layer 214, and permanent magnet bias layers 219 and 220 face air bearing surface (ABS) 222.

Figure 11:
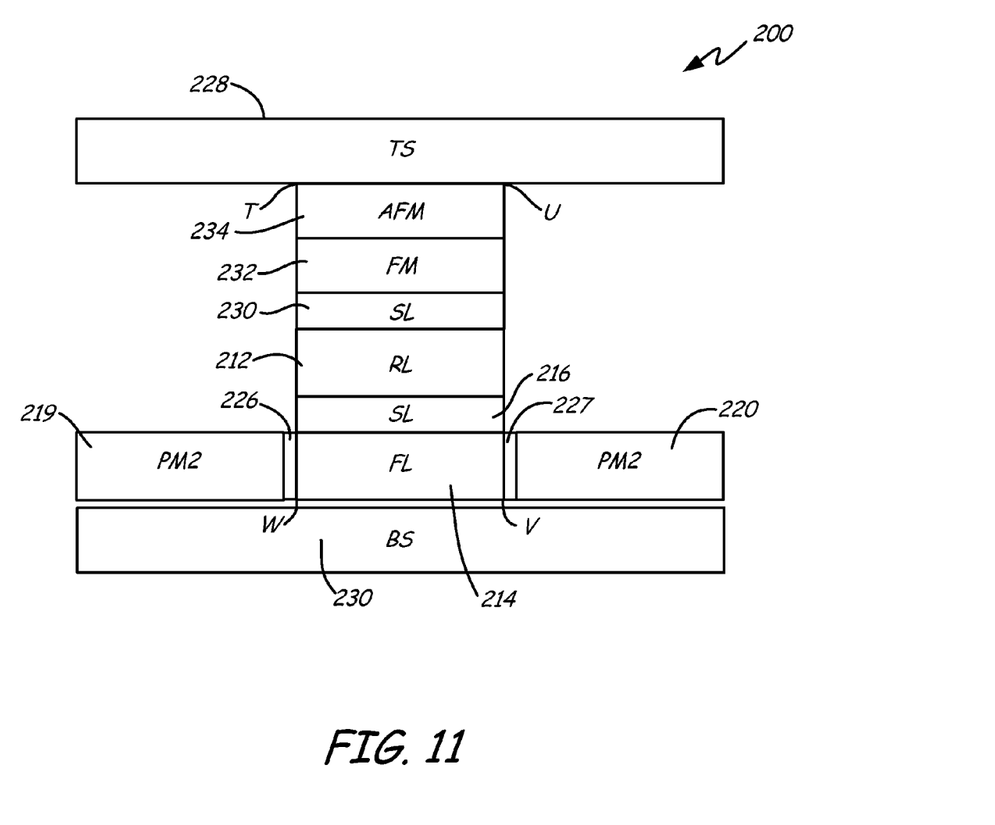
FIG. 11 is a schematic ABS view of the reader stack in FIG. 10.

An ABS view of reader stack 200 is shown in FIG. 11. Top shield 228 and bottom shield 230 are shown defining active area TUVW of reader stack 200 at ABS 222. First permanent magnet bias layer 218 is distal from ABS 222 and is behind reference layer 212 in the FIG. Second permanent magnet bias layers 219 and 220 are shown separated from free layer 214 by electrically insulating layers 226 and 227. A single second permanent bias magnet layer can be used depending on the system requirements. In addition to first permanent bias magnet 218, reference layer 212 is also biased by ferromagnetic layer 232 which is pinned by antiferromagnetic layer 234. Ferromagnetic layer 232 and first permanent bias magnet 218 both bias reference layer 212 in a direction perpendicular to ABS 222.

Figure 12A:
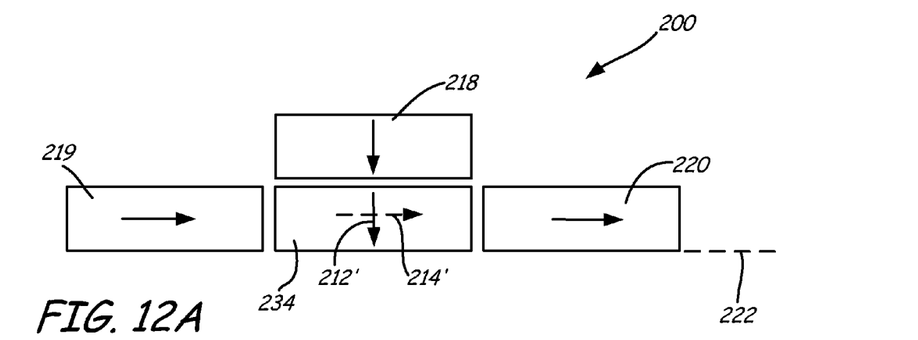
FIG. 12A is a schematic top view of the reader stack in FIG. 9 showing biasing in the absence of external bit flux.
Figure 12B:
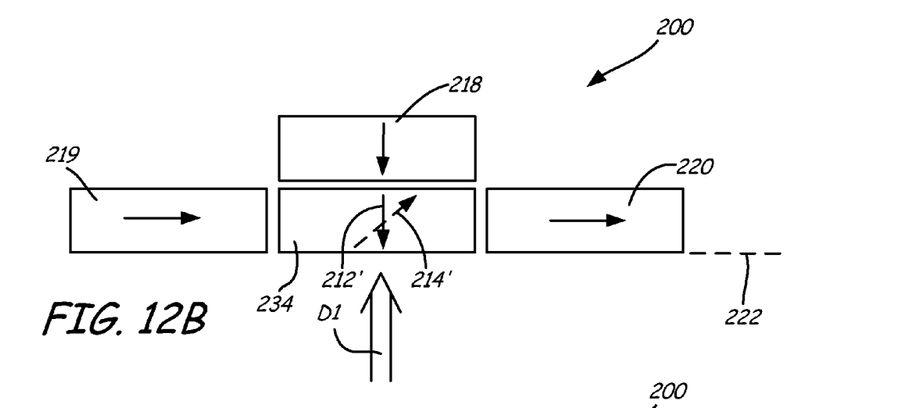
FIG. 12B is a schematic top view of the reader stack in FIG. 9 under the influence of a first state of data.
Figure 12C:
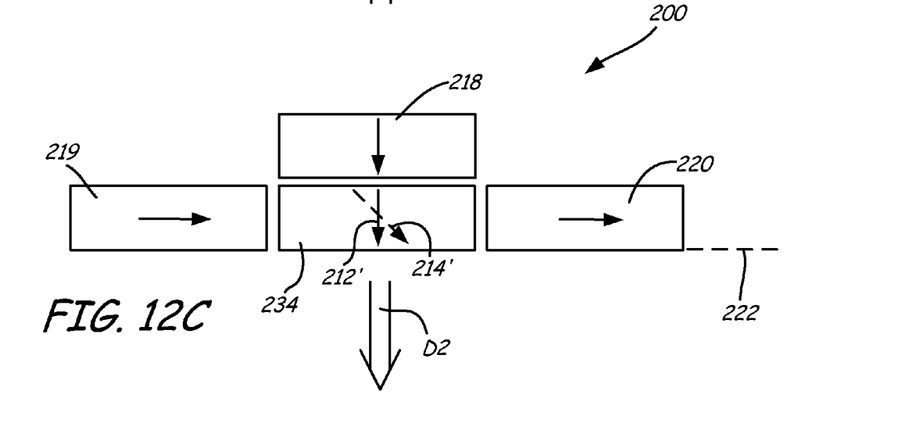
FIG. 12C is a schematic top view of the reader stack in FIG. 9 under the influence of a second state of data.

For enhanced sensitivity the magnetization directions of layers 212 and 214 need to be biased generally orthogonal with respect to one another. This magnetization configuration allows for greater sensitivity in response to flux emanating from the recording media and allows for greater control over the magnetic response of the free layers to the magnetic fields of the recording media. FIGS. 12A, 12B, and 12C show top views of reader stack 200 with the magnetization vectors of permanent magnet biasing layers 118, 119, and 120 and antiferromagnetic stack 234 oriented to achieve enhanced response of reference layer 212 and free layer 214 to external magnetic fields. FIGS. 12A-12C illustrate the effect of varying bit magnetizations on the recorded media on the magnetization directions 212' and 214' of reference layer 212 and free layer 214 respectively. Magnetizations of permanent magnet bias layers 218, 219, and 220 as well as ferromagnetic layer 232 are set substantially orthogonal as shown. FIG. 11A shows reader stack 200 in a quiescent magnetic state when it is not under the influence of magnetic flux emanating from the recording media. As can be seen, the angle of magnetization between reference layer 212 and free layer 214 at ABS 222 is generally orthogonal. FIG. 12B is a top view of reader stack 200 showing reader stack 200 under the influence of a first state of data D1 corresponding to a positive bit. This first state of data causes the angle of magnetization between reference layer 212 and free layer 214 to increase at ABS 222. When this occurs, the resistance across reader stack 200 changes and is detected as a change in voltage as a sense current is passed through reader stack 200. FIG. 12C is a top view of reader stack 200 showing reader stack 200 under the influence of a second state of data D2 corresponding to a negative bit. This state of data causes the angle of magnetization between reference layer 212 and free layer 214 to decrease at ABS 222. As with the first state of data, the second state of data causes a change in resistance of reader stack 200 and is detected as a change in voltage as a sense current is passed through reader stack 200.

First permanent magnet bias layer 218 is a high coercivity magnet comprising magnetic setting field exceeding 2T. Second permanent magnet bias layers 219 and 220 are high moment magnets with magnetic setting fields sufficiently below the setting field of first permanent magnet bias layer 218 (eg. about 6 KOe to about 7 KOe) such that the setting of first permanent magnet bias layer 218 is not affected by the setting of second permanent magnet bias layers 219 and 220. First permanent magnet bias layer 218 is, for example, a high coercivity $L1_0$ phase FePt alloy and second permanent magnet bias layers 119 and 120 are, for example, $Co_3Pt$. Reference layer 212 may be a single ferromagnetic layer or a trilayer comprising a ferromagnetic reference layer, a spacer layer, and an antiferromagnetic layer. The ferromagnetic layer can be, for example, CoFe. The spacer layer can be ruthenium and the antiferromagnetic layer can be, for instance, IrMn or PtMn. Free ferromagnetic layer 214 is preferably ferromagnetic material with good anisotropy, such as NiFeCo or CoFeHf. Shield layers 228 and 230 are preferably NiFe, iron amorphous alloys, permalloy, or sendust. Spacer layers 216 and 230 may be a conductor such as Cu, Ag, or Au if stack 200 is a GMR stack or an insulator such as $Al_2O_3$, $TiO_2$ or NgO if stack 200 is a TGMR stack.

In FIG. 12A the initial magnetization direction of reference layer 212 and free layer 214 are shown to be orthogonal. Magnetic alignment between first and second permanent magnet bias layers 218, 219, and 220 is adjustable by altering the direction of the setting field magnetizing the bias layers. The strength of the magnetic field of each permanent magnet bias layer can be controlled by varying the thickness of the bias magnet layers. These modifications can be performed as the particular specifications of the MR reader containing sensor stack 200 dictate.

To summarize, a biasing system for a trilayer magnetoresistive reader stack allows each ferromagnetic layer in the reader stack to be individually biased by permanent magnet layers adjacent the ferromagnetic layers external to the reader track width dimension. The trilayer reader stack includes a first ferromagnetic layer and a second ferromagnetic layer sandwiching a spacer layer between the first and second ferromagnetic layers. Magnetization rotation in one or both of the ferromagnetic layers occurs in response to magnetic flux from a recording medium, and a magnetoresistive effect is produced based upon the angle between the magnetization directions of the ferromagnetic layers. The ferromagnetic layers are positioned in the trilayer reader stack such that quiescent state unbiased magnetizations of the ferromagnetic layers are substantially orthogonal.

Although the present disclosure has been described with reference to preferred embodiments, workers skilled in the art will recognize that changes may be made in form and detail without departing from the spirit and scope of the technology. The implementation described above and other implementations are within the scope of the following claims.

The invention claimed is:

1. An apparatus comprising:
a first ferromagnetic layer separated from a second ferromagnetic layer by a nonmagnetic layer, each ferromagnetic layer having an air bearing surface (ABS), first biasing surface, and second biasing surface, the first and second biasing surfaces respectively connected in a substantially triangular shape;
a high coercivity magnetic bias element separated from the ABS and positioned proximal the first biasing surface of the first ferromagnetic layer to bias the first ferromagnetic layer to a first direction; and
a high moment magnetic bias element laterally separated from the high coercivity magnetic bias element along a plane orthogonal to the ABS, the high moment magnetic bias element separated from the ABS and positioned proximal the second biasing surface of the second ferromagnetic layer to bias the second ferromagnetic layer to a second direction substantially orthogonal to the first direction, wherein the high coercivity and high moment magnetic bias elements have different magnetic setting fields.

2. The apparatus of claim 1 wherein the magnetization of the first and second ferromagnetic layers are biased substantially at 45 degrees to the air bearing surface.

3. The apparatus of claim 1, wherein the nonmagnetic layer comprises an electrically conducting metal layer.

4. The apparatus of claim 3, wherein the nonmagnetic layer is selected from the group consisting of copper (Cu), silver (Ag) and gold (Au).

5. The apparatus of claim 1, wherein the nonmagnetic layer comprises an electrically insulating layer.

6. The apparatus of claim 5, wherein the nonmagnetic layer is selected from the group consisting of aluminum oxide ($Al_2O_3$), titanium dioxide ($TiO_2$) and magnesium oxide (MgO).

7. The apparatus of claim 1, wherein the high coercivity magnetic bias element has a setting field exceeding 2T.

8. The apparatus of claim 1, wherein the high moment magnetic bias element has a setting field of about 6 KOe to about 7 KOe.

9. The apparatus of claim 1, wherein the first and second ferromagnetic layers are NiFeCo or CoFeHf.

10. The apparatus of claim 1, wherein the first and second ferromagnetic layers are free layers.

11. An apparatus comprising:
a trilayer reader stack including a first ferromagnetic layer, a second ferromagnetic layer and a nonmagnetic layer positioned therebetween, each ferromagnetic layer having an air bearing surface (ABS), first biasing surface, and second biasing surface respectively connected in a substantially triangular shape; and
first biasing means positioned on a first side of the first ferromagnetic layer by being positioned proximal the first biasing surface, distal the ABS; and
second biasing means positioned proximal the second biasing surface, distal the ABS on a different second side of the second ferromagnetic layer, wherein the first and second bias means have different magnetic setting fields.

12. The apparatus of claim 11, wherein the biasing means of the first ferromagnetic layer is an $L1_0$ long range ordered FePt alloy phase high coercivity magnet with a setting field exceeding 2T.

13. The apparatus of claim 12, wherein the biasing means of the second ferromagnetic layer is a high moment magnet with a setting field of about 6 KOe to about 7 KOe.

14. The apparatus of claim 13, wherein the high moment magnet is $Co_3Pt$.

15. The apparatus of claim 11 wherein the nonmagnetic layer comprises one of copper (Cu), silver (Ag), gold (Au), aluminum oxide ($Al_2O_3$), titanium dioxide ($TiO_2$), and magnesium oxide (MgO).

16. A magnetic element comprising:
a magnetic stack having a first ferromagnetic layer separated from a second ferromagnetic layer by a nonmagnetic layer on an air bearing surface (ABS), the first and second ferromagnetic layers each having first and second biasing surfaces with non-normal orientations with respect to the ABS;
a high coercivity magnetic bias element positioned adjacent the first biasing surface of the first ferromagnetic layer and configured to bias the first ferromagnetic layer in a first direction; and
a high moment magnetic bias element positioned adjacent the second biasing surface of the second ferromagnetic layer and configured to bias the second ferromagnetic layer in a second direction substantially orthogonal to the first direction.

17. The magnetic element of claim 16, wherein the high coercivity and high moment magnetic bias elements each have substantially rectangular shapes that continuously extend along the entirety of the first and second biasing surfaces, respectively.

* * * * *